United States Patent
Fujimoto et al.

(10) Patent No.: US 11,117,365 B2
(45) Date of Patent: Sep. 14, 2021

(54) PRINTING DEVICE

(71) Applicant: YAMAHA HATSUDOKI KABUSHIKI KAISHA, Iwata (JP)

(72) Inventors: Takeshi Fujimoto, Iwata (JP); Katsumi Totani, Iwata (JP); Takeshi Miwa, Iwata (JP); Kazuyuki Sugahara, Iwata (JP)

(73) Assignee: YAMAHA HATSUDOKI KABUSHIKI KAISHA, Iwata (JP)

( * ) Notice: Subject to any disclaimer, the term of this patent is extended or adjusted under 35 U.S.C. 154(b) by 0 days.

(21) Appl. No.: 17/050,738

(22) PCT Filed: Jun. 5, 2018

(86) PCT No.: PCT/JP2018/021532
§ 371 (c)(1),
(2) Date: Oct. 26, 2020

(87) PCT Pub. No.: WO2019/234820
PCT Pub. Date: Dec. 12, 2019

(65) Prior Publication Data
US 2021/0237425 A1     Aug. 5, 2021

(51) Int. Cl.
*B41F 15/08* (2006.01)
*B41F 15/40* (2006.01)
*B41F 35/00* (2006.01)

(52) U.S. Cl.
CPC .............. *B41F 15/08* (2013.01); *B41F 15/40* (2013.01); *B41F 35/00* (2013.01)

(58) Field of Classification Search
CPC ................................ B41F 15/08; B41F 15/40
See application file for complete search history.

(56) References Cited

U.S. PATENT DOCUMENTS

| 5,746,127 A | 5/1998 | Fischbeck et al. |
| 2011/0303108 A1 | 12/2011 | Tanaka |
| 2014/0115874 A1* | 5/2014 | Narita ............... B41F 15/42 29/593 |

FOREIGN PATENT DOCUMENTS

| CN | 102348556 A | 2/2012 |
| CN | 103380000 A | 10/2013 |
| CN | 104626732 A | 5/2015 |
| JP | S61-168997 A | 7/1986 |
| JP | S62-132643 A | 6/1987 |
| JP | H08-309958 A | 11/1996 |
| JP | 2001-191483 A | 7/2001 |
| JP | 2001-315304 A | 11/2001 |
| JP | 2002-103564 A | 4/2002 |
| JP | 2004-322383 A | 11/2004 |
| JP | 2013-018123 A | 1/2013 |

(Continued)

OTHER PUBLICATIONS

International Search Report issued in PCT/JP2018/021532; dated Jul. 10, 2018.

(Continued)

*Primary Examiner* — Leslie J Evanisko
(74) *Attorney, Agent, or Firm* — Studebaker & Brackett PC

(57) ABSTRACT

A printing device includes a controller configured or programmed to acquire, based on a width of a coating material that has been measured, at least one of a start position, an end position, or an amount of movement of a coating material scooping unit in coating material scooping operation.

20 Claims, 8 Drawing Sheets

(56) References Cited

FOREIGN PATENT DOCUMENTS

JP          5873928 B2     3/2016
JP      2017-071072 A     4/2017

OTHER PUBLICATIONS

Written Opinion issued in PCT/JP2018/021532; dated Jul. 10, 2018.
An Office Action mailed by China National Intellectual Property Administration dated Jun. 23, 2021, which corresponds to Chinese Patent Application No. 201880092680.0 and is related to U.S. Appl. No. 17/050,738; with English language translation.

* cited by examiner

PRINTING DEVICE

CROSS-REFERENCE TO RELATED APPLICATION

This application is a National Stage of International Patent Application No. PCT/JP2018/021532, filed Jun. 5, 2018, the entire content of which is incorporated herein by reference.

BACKGROUND

Technical Field

The present disclosure relates to a printing device, and more particularly, it relates to a printing device including a coating material scooping unit configured to scoop a coating material on a mask.

Background Art

Conventionally, a printing device including a coating material scooping unit configured to scoop a coating material on a mask is known. Such a printing device is disclosed in Japanese Patent No. 5873928, for example.

Japanese Patent No. 5873928 discloses a printer (printing device) configured to print a cream solder on a surface of a printed board by moving the cream solder (coating material) on a mask with a squeegee. This printer includes a solder loading and unloading device (a coating material scooping unit) configured to scoop the cream solder on the mask. This solder loading and unloading device conceivably moves on the mask from a design start position to a design end position and performs scooping operation to scoop the cream solder on the mask.

SUMMARY

However, in the printer described in Japanese Patent No. 5873928, the solder loading and unloading device conceivably moves from the design start position to the design end position and performs the scooping operation, and thus the actual width of the cream solder does not appear to have been taken into account. In this case, the cream solder scooping operation may conceivably fail due to an insufficient amount of movement of the solder loading and unloading device. In this respect, the printer described in Japanese Patent No. 5873928 has room for improvement.

Accordingly, the present disclosure provides a printing device capable of significantly reducing or preventing failure of coating material scooping operation due to an insufficient amount of movement of a coating material scooping unit in the coating material scooping operation.

A printing device according to an aspect of the present disclosure includes a squeegee configured to print, on a board, a coating material on a mask, a coating material scooping unit configured to scoop the coating material on the mask, a coating material width measuring unit configured to measure a width of the coating material on the mask, and a controller configured or programmed to acquire, based on the width of the coating material that has been measured, at least one of a start position of movement of the coating material scooping unit in coating material scooping operation, an end position of the movement of the coating material scooping unit in the coating material scooping operation, or an amount of the movement of the coating material scooping unit in the coating material scooping operation.

The printing device according to this aspect of the present disclosure is configured as described above such that the start position suitable for the actual width of the coating material, the end position suitable for the actual width of the coating material, or the amount of movement suitable for the actual width of the coating material can be determined in consideration of the actual width of the coating material. Consequently, it is possible to provide the printing device capable of significantly reducing or preventing failure of the coating material scooping operation due to an insufficient amount of movement of the coating material scooping unit in the coating material scooping operation. Furthermore, when the amount of movement suitable for the actual width of the coating material is acquired, an unnecessary increase in the amount of movement of the coating material scooping unit in the coating material scooping operation can be significantly reduced or prevented. Thus, the time required for the coating material scooping operation can be reduced to the minimum necessary.

The aforementioned printing device according to this aspect preferably further includes a mask mover configured to move the mask, and the controller is preferably configured or programmed to control the mask mover to move the mask such that the coating material to be scooped is located within an operating range of the coating material scooping unit when the coating material to be scooped is located outside the operating range of the coating material scooping unit. Accordingly, the operating range of the coating material scooping unit can be reduced by the amount of movement of the mask that can be moved by the mask mover. Consequently, the device can be downsized by a reduction in the operating range of the coating material scooping unit.

In this case, the printing device preferably further includes a mask replacer including the mask mover and a mask storage configured to store the mask. Accordingly, the mask mover of the mask replacer can be used as a mask mover that moves the mask such that the coating material is located within the operating range of the coating material scooping unit. Consequently, it is not necessary to provide a mask mover separately from the mask mover of the mask replacer. Consequently, a mask mover is not provided separately from the mask mover of the mask replacer, and thus the number of components can be reduced while the structure can be simplified. Furthermore, the mask can be automatically replaced by the mask replacer as a mask replacer, and thus it is possible to save a user the trouble of replacing the mask.

In the aforementioned structure including the mask replacer, the controller is preferably configured or programmed to control the coating material scooping unit to scoop the coating material on the mask to be replaced before mask replacement operation by the mask replacer and unload the coating material onto a replacement mask after the mask replacement operation by the mask replacer. Accordingly, the coating material scooping unit can automatically transfer the coating material from the mask to the mask, and thus it is possible to save the user the trouble of transferring the coating material from the mask to the mask.

The aforementioned printing device according to this aspect preferably further includes a scooping state detector configured to detect a state of coating material scooping by the coating material scooping unit after the coating material scooping operation. Accordingly, it can be checked whether or not the coating material has been correctly scooped by the coating material scooping unit. Consequently, when the coating material has not been correctly scooped by the coating material scooping unit, the device can be caused to appropriately operate such as stop, and it is possible to prevent printing defects from occurring.

In this case, the scooping state detector preferably includes the coating material width measuring unit. Accordingly, it is not necessary to provide the scooping state detector separately from the coating material width measuring unit. Consequently, the scooping state detector is not provided separately from the coating material width measuring unit, and thus the number of components can be reduced while the structure can be simplified.

In the aforementioned structure including the scooping state detector, the scooping state detector preferably includes an imager, a light detector, or a weight detector. Accordingly, the state of coating material scooping by the coating material scooping unit can be easily detected by the imager, the light detector, or the weight detector after the coating material scooping operation.

In the aforementioned structure including the scooping state detector, the controller is preferably configured or programmed to perform a control to notify a user to check a state of the coating material when the state of the coating material scooping by the coating material scooping unit is abnormal. Accordingly, based on the information of which the user is notified, the user can quickly perform an operation to resolve the abnormality Consequently, even when the device is stopped due to the abnormality, the abnormality can be quickly resolved, and the stop time of the device can be reduced.

In the aforementioned structure including the scooping state detector, the controller is preferably configured or programmed to control the coating material scooping unit to unload the coating material when the state of the coating material scooping by the coating material scooping unit is abnormal. Accordingly, even when only a portion of the coating material is scooped by the coating material scooping unit at the time of abnormality, only the scooped portion of the coating material can be unloaded from the coating material scooping unit. Consequently, it is possible to significantly reduce or prevent the next coating material scooping operation by the coating material scooping unit in a state in which only a portion of the coating material has been scooped by the coating material scooping unit. Thus, it is possible to significantly reduce or prevent failure of the next coating material scooping operation by the coating material scooping unit due to only a portion of the coating material scooped by the coating material scooping unit.

According to the present disclosure, as described above, it is possible to provide the printing device capable of significantly reducing or preventing the failure of the coating material scooping operation due to an insufficient amount of movement of the coating material scooping unit in the coating material scooping operation.

DETAILED DESCRIPTION

An embodiment embodying the present disclosure is hereinafter described on the basis of the drawings.

Figure 1:
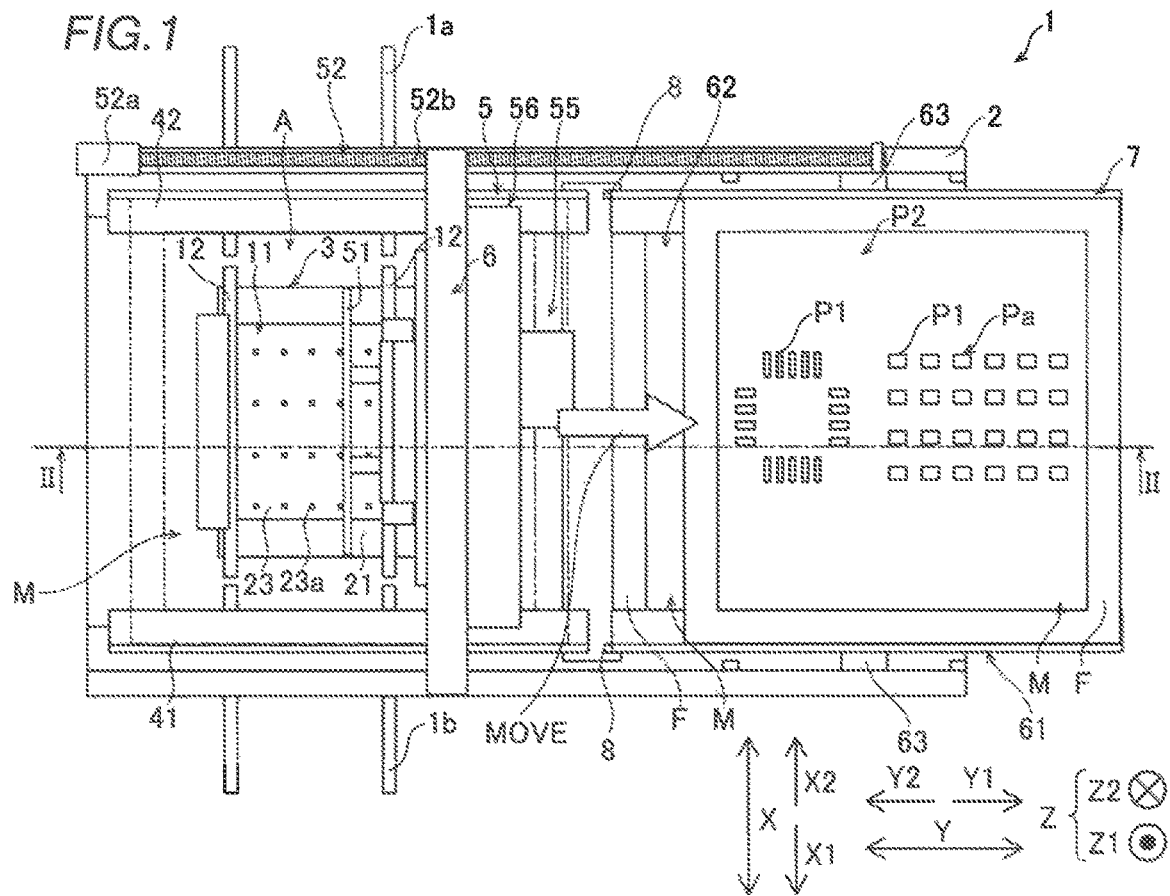
FIG. 1 is a plan view schematically showing the overall structure of a printing device according to an embodiment.

The structure of a printing device 1 according to the embodiment of the present disclosure is now described with reference to FIGS. 1 to 9D. As shown in FIG. 1, the printing device 1 is a device that conveys a board B (see FIG. 2) in an X1 direction by a pair of conveyors 12 and prints a solder S (see FIGS. 6A to 6G) on the board B in a printing position. The board B is a printed board on which components (electronic components) are mounted. The solder S is a joining material for joining the components on the board B. In the following description, a direction (X1 direction) of conveyance of the board B by the pair of conveyors 12 (belt conveyors) and the opposite direction (X2 direction) are defined as an X direction, and a direction substantially orthogonal to the X direction in a horizontal direction is defined as a Y direction. Furthermore, a direction substantially orthogonal to the X direction and the Y direction is defined as a Z direction (upward-downward direction). The solder S is an example of a "coating material" in the claims.

The printing device 1 is configured to carry in the board B by carry-in conveyors 1a, perform a printing operation on a surface of the board B carried in with a printing pattern Pa formed on a mask M, and then carry out the board B on which the printing operation has been performed by carry-out conveyors 1b. The mask M has a rectangular flat plate shape in a plan view (as viewed from the Z1 direction side). The mask M includes a plurality of openings P1 that form the printing pattern Pa and a non-opening P2 that is a region other than the plurality of openings P1. Furthermore, a frame F is attached to the outer peripheral portion of the mask M. Note that FIGS. 1 to 3 show a state in which the mask M has been moved from an operation position A in which a printing operation is performed with the mask M to a mask replacement unit 7 described below.

Figure 2:
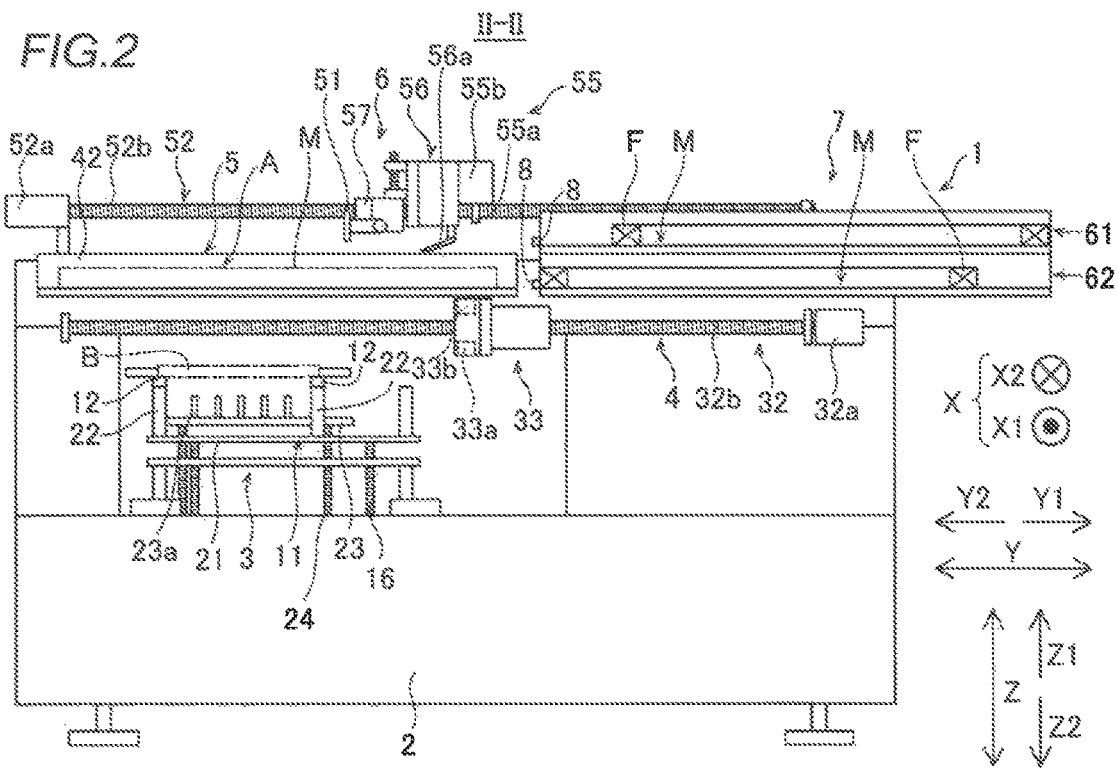
FIG. 2 is a schematic sectional view taken along the line II-II in FIG. 1.
Figure 3:
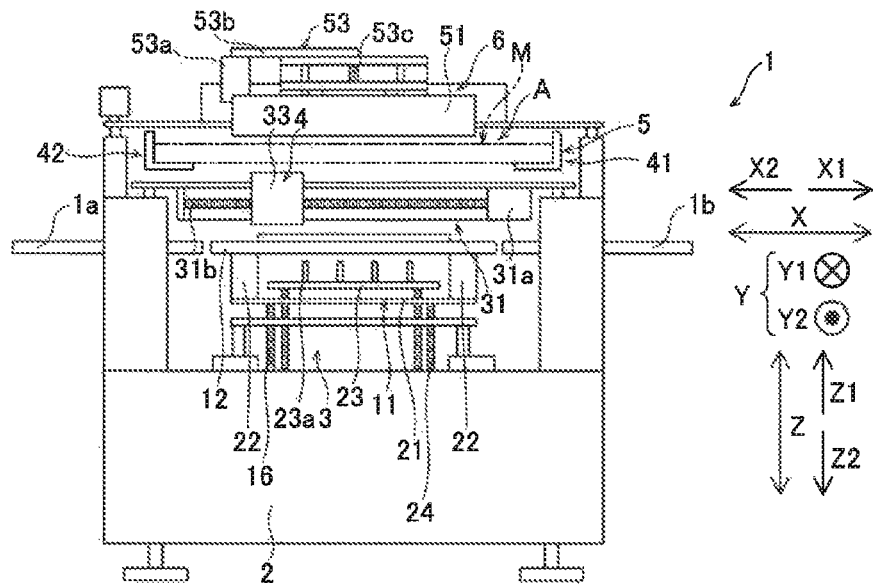
FIG. 3 is a schematic side view showing the overall structure of the printing device according to the embodiment.
Figure 5:
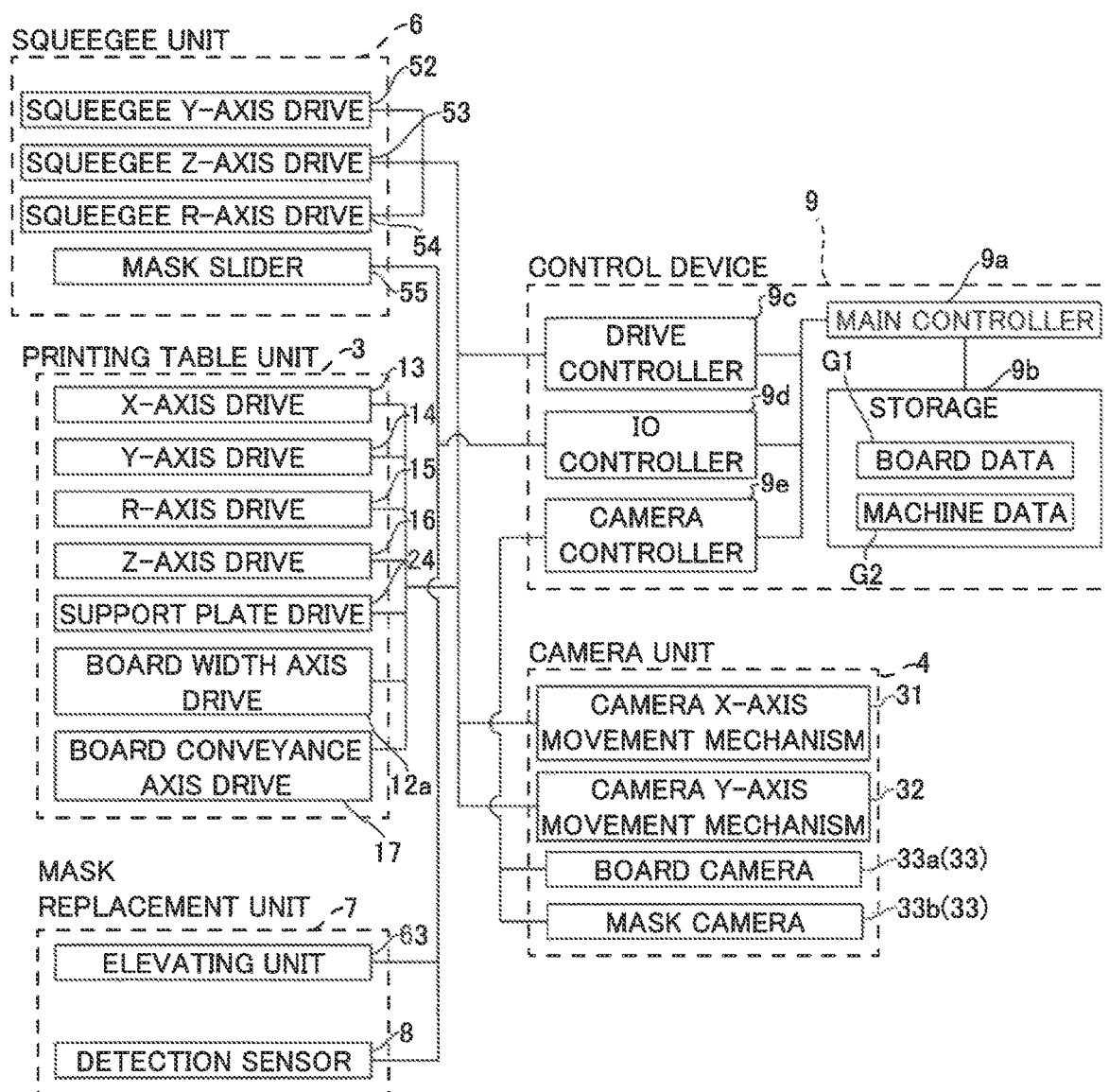
FIG. 5 is a block diagram showing the control structure of the printing device according to the embodiment.

As shown in FIG. 2, the printing device 1 includes a base 2, a printing table unit 3, a camera unit 4, a mask clamp member 5, a squeegee unit 6, the mask replacement unit 7, detection sensors 8, and a control device 9 (see FIG. 5). The control device 9 is an example of a "controller" in the claims.

The printing table unit 3 is provided on the base 2, and is configured to hold the board B and align the board B with respect to the mask M. Specifically, the printing table unit 3 includes an X-axis movement mechanism (not shown), a Y-axis movement mechanism (not shown), an R-axis movement mechanism (not shown), a Z-axis movement mechanism (not shown), a printing table 11, and the pair of conveyors 12 (see FIG. 1).

The X-axis movement mechanism includes an X-axis drive 13 (see FIG. 5) as a drive source to move the printing table 11 in the X direction. The Y-axis movement mechanism includes a Y-axis drive 14 (see FIG. 5) as a drive source to move the printing table 11 in the Y direction. The R-axis movement mechanism includes an R-axis drive 15 (see FIG. 5) as a drive source to rotate the printing table 11 about a rotation axis that extends in the Z direction. The Z-axis movement mechanism includes a Z-axis drive 16 (see FIG. 5) as a drive source to move the printing table 11 in the Z direction.

The printing table 11 includes a table body 21, a pair of bracket members 22 provided on the table body 21, a support plate 23 on which a plurality of backup pins 23a are arranged, and a support plate drive 24 configured to move the support plate 23 in the Z direction. The conveyor 12 (see FIG. 1) is provided on each of upper portions of the pair of bracket members 22. The backup pins 23a are configured to support the board B from below by movement of the support plate 23 in a Z1 direction (upward direction) by the support plate drive 24.

As shown in FIG. 1, the pair of conveyors 12 are provided so as to extend along the X direction. The pair of conveyors 12 are arranged parallel to each other with a predetermined distance in the Y direction. Furthermore, an interval between the pair of conveyors 12 in the Y direction can be adjusted according to the width of the board B to be conveyed. Specifically, a board width axis drive 12a (see FIG. 5) is configured to adjust the interval (width) between the pair of conveyors 12 in the Y direction.

The camera unit 4 is configured to image the mask M and the board B, as shown in FIGS. 2 and 3. Specifically, the camera unit 4 includes a camera X-axis movement mechanism 31, a camera Y-axis movement mechanism 32, and an imager 33 including a board camera 33a and a mask camera 33b. The camera X-axis movement mechanism 31 includes an X-axis motor 31a and a ball screw 31b that extends in the X direction. The camera Y-axis movement mechanism 32 includes a Y-axis motor 32a and a ball screw 32b that extends in the Y direction. The board camera 33a is configured to image the board B and recognize the relative position of the board B with respect to the printing table 11. The mask camera 33b is configured to image the mask M and recognize the position of the mask M.

Thus, in the printing device 1, after the relative position of the board B with respect to the mask M is recognized using the board camera 33a and the mask camera 33b, the board B is accurately positioned (the position and inclination in a horizontal plane) relative to the mask M by the X-axis movement mechanism, the Y-axis movement mechanism, and the R-axis movement mechanism of the printing table unit 3. Then, in the printing device 1, the board B is raised by the Z-axis movement mechanism of the printing table unit 3, and is brought into contact with the lower surface of the mask M in a state in which the board B is accurately positioned relative to the mask M.

As shown in FIG. 3, the mask clamp member 5 is configured to hold the mask M in the operation position A when the solder S is printed in the printing pattern Pa on the board B using the mask M. Specifically, the mask clamp member 5 includes a first mask holder 41 configured to hold an end of the mask M on the X1 direction side, a second mask holder 42 configured to hold an end of the mask M on the X2 direction side, and a pressing portion (not shown) provided on the first mask holder 41 and configured to press the mask M in the X2 direction.

As shown in FIGS. 2 and 3, the squeegee unit 6 is configured to reciprocate in the Y direction to move the solder S supplied onto the upper surface of the mask M while scraping the solder S along the upper surface of the mask M. Specifically, the squeegee unit 6 includes a squeegee 51, a squeegee Y-axis drive 52 that moves the squeegee 51 in a printing direction (Y direction), a squeegee Z-axis drive 53 that moves the squeegee 51 in the upward-downward direction (Z direction), and a squeegee R-axis drive 54 (see FIG. 5) that rotates the squeegee 51 about a rotation axis that extends in the X direction.

The squeegee 51 extends in the X direction. The squeegee 51 is configured to print the solder S supplied to the mask M while applying a predetermined printing pressure (load) to the mask M. The squeegee Y-axis drive 52 includes a Y-axis motor 52a and a ball screw 52b that extends in the Y direction. The squeegee Z-axis drive 53 includes a Z-axis motor 53a, a belt 53b, and a ball screw 53c that extends in the Z direction.

The squeegee unit 6 includes a mask slider 55 that slides the mask M in the Y direction and replaces the mask M, as shown in FIG. 2. A single mask slider 55 is provided in the squeegee unit 6. The mask slider 55 includes a slide portion 55a that is movable in the Z direction (upward-downward direction) and a housing 55b that houses the slide portion 55a. The mask slider 55 includes an air cylinder, for example, the slide portion 55a includes a rod of the air cylinder, and the housing 55b includes a cylinder of the air cylinder. The mask slider 55 is an example of a "mask mover" in the claims.

The mask slider 55 is configured to move integrally in the Y direction by movement of the squeegee 51 in the Y direction by the squeegee Y-axis drive 52. In the mask slider 55, the slide portion 55a moves in a Z2 direction (downward direction) so as to protrude from the housing 55b to a position in which the slide portion 55a can contact the frame F of the mask M in the operation position A in the horizontal direction (Y direction). In the mask slider 55, the slide portion 55a moves in the Z1 direction (upward direction) to a position in which the slide portion 55a does not contact the frame F of the mask M in the operation position A in the horizontal direction (Y direction) so as to be housed in the housing 55b.

Thus, the squeegee 51 and the mask slider 55 are integrally provided in the squeegee unit 6. The squeegee 51 and the mask slider 55 are integrally moved in the Y direction by movement of the squeegee unit 6. The slide portion 55a of the mask slider 55 contacts the frame F of the mask M from the Y1 direction side or the Y2 direction side and moves the mask M in a Y1 direction or a Y2 direction.

The squeegee unit 6 includes a solder scooping unit 56 that scoops the solder S on the mask M. The solder scooping unit 56 includes a scoop 56a configured to scoop and hold the solder S on the mask M. The scoop 56a is configured to be movable in the Z direction (upward-downward direction) between a lowered position for scooping the solder S on the mask M or unloading the scooped solder S onto the mask M, and a raised position for not scooping the solder S on the mask M. The solder scooping unit 56 is configured to move integrally in the Y direction by movement of the squeegee 51 in the Y direction by the squeegee Y-axis drive 52. The solder scooping unit 56 scoops and holds, on the scoop 56a, the solder S on the mask M by moving in the Y2 direction in a state in which the scoop 56a is arranged in the lowered position. Furthermore, the solder scooping unit 56 unloads the scooped solder S from the scoop 56a onto the mask M by moving in the Y1 direction in a state in which the scoop 56a is arranged in the lowered position. The solder scooping unit 56 is an example of a "coating material scooping unit" in the claims.

Figure 7:
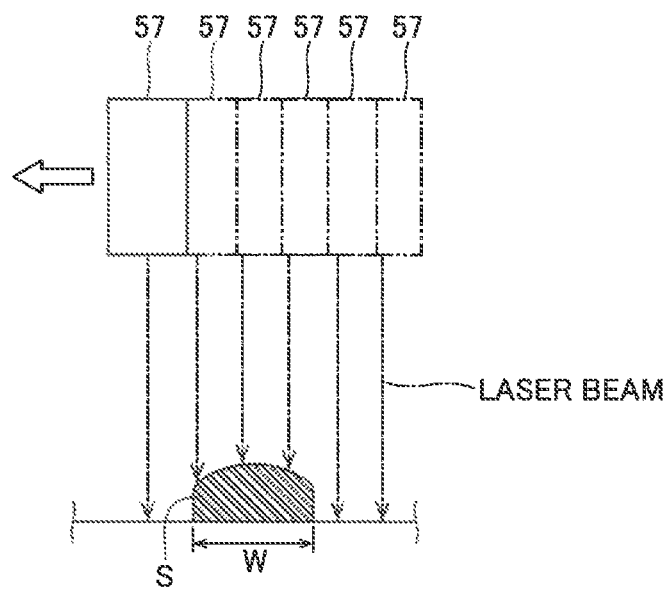
FIG. 7 is a schematic view for illustrating solder width measurement in the printing device according to the embodiment.

As shown in FIGS. 2 and 7, the squeegee unit 6 includes a solder width measuring unit 57 configured to measure the width W (see FIG. 7) of the solder S (solder roll) on the mask M. The width W of the solder S refers to the length of the solder S in the Y direction. The solder width measuring unit 57 is configured to move in the Y direction integrally by movement of the squeegee 51 in the Y direction by the squeegee Y-axis drive 52. The solder width measuring unit 57 irradiates the solder S on the mask M with a laser beam while moving in the Y direction within a range from one end of the solder S in the Y direction to the other end, and receives the laser beam reflected from the solder S on the mask M. Thus, the solder width measuring unit 57 acquires the measurement result of the solder S. The control device 9 acquires the width W of the solder S based on the measurement result of the solder S acquired by the solder width measuring unit 57. The solder width measuring unit 57 is an example of the "coating material width measuring unit" in the claims.

Figure 4A:
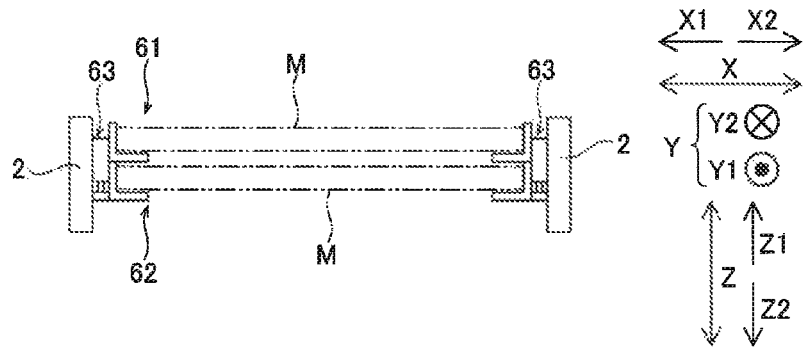
FIG. 4A is a schematic view showing a state in which a mask replacement unit has been raised.
Figure 4B:
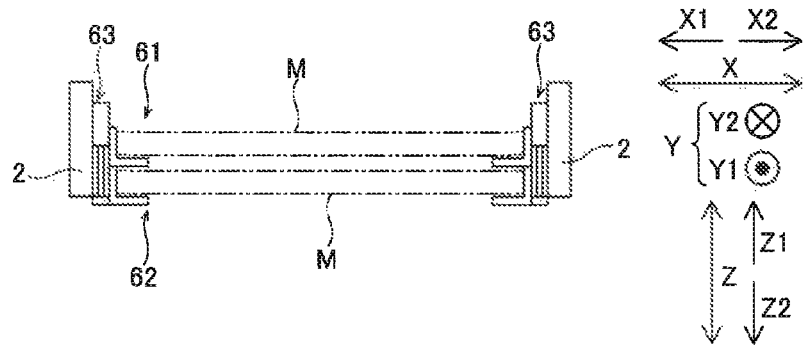
FIG. 4B is a schematic view showing a state in which the mask replacement unit has been lowered.

As shown in FIGS. 4A and 4B, the mask replacement unit 7 is configured to store a plurality of (two) masks M. Specifically, the mask replacement unit 7 includes a first storage 61, a second storage 62, and an elevating unit 63. The first storage 61 and the second storage 62 are each configured to store one mask M. The first storage 61 and the second storage 62 are aligned in the upward-downward direction. The first storage 61 is an upper storage arranged above the second storage 62. The second storage 62 is a lower storage arranged below the first storage 61. The elevating unit 63 is configured to move the first storage 61 and the second storage 62 in the upward-downward direction. In the mask replacement unit 7, the elevating unit 63 is attached to the base 2. In the mask replacement unit 7, the second storage 62 is attached to the elevating unit 63. In the mask replacement unit 7, the first storage 61 is attached to the second storage 62. Thus, the first storage 61 and the second storage 62 are integrally moved up and down as the elevating unit 63 moves up and down. The first storage 61 and the second storage 62 are configured to be movable in the Z direction (upward-downward direction) between a lowered position for loading and unloading the mask M into and from the first storage 61 and a raised position for loading and unloading the mask M into and from the second storage 62. The mask replacement unit 7 includes the mask slider 55. The mask replacement unit 7 is an example of a "mask replacer" in the claims. The first storage 61 and the second storage 62 are examples of a "mask storage" in the claims.

As shown in FIG. 2, the detection sensors 8 are configured to detect the mask M in a state of straddling the mask clamp member 5 and the mask replacement unit 7. The detection sensor 8 is provided on each of the first storage 61 and the second storage 62. Specifically, the detection sensor 8 provided on the first storage 61 is configured to detect the mask M stopped in a state of straddling the mask clamp member 5 and the first storage 61 when the mask M is moved between the operation position A and the first storage 61. The detection sensor 8 provided on the second storage 62 is configured to detect the mask M stopped in a state of straddling the mask clamp member 5 and the second storage 62 when the mask M is moved between the operation position A and the second storage 62. The detection sensors 8 are transmissive sensors, for example, and each include a projector (not shown) that emits light and a light receiver (not shown) that receives the light emitted from the projector.

As shown in FIG. 5, the control device 9 includes a main controller 9a, a storage 9b, a drive controller 9c, an IO controller 9d, and a camera controller 9e. The main controller 9a includes a central processing unit (CPU). The storage 9b includes a read-only memory (ROM), a random access memory (RAM), etc., and stores board data G1, machine data G2, and a printing program. The main controller 9a has a function of controlling each unit of the printing device 1 based on the printing program stored in the storage 9b. The board data G1 includes information about the type of the board B, information about the size of the board B, information about the mask M corresponding to the type of the board B, information about the number of boards on which the solder S is to be printed for each type of the board B, etc. The machine data G2 includes information about a movement limit position of the squeegee unit 6 in the Y direction, information about movement limit positions of the camera unit 4 in the X and Y directions, etc.

The main controller 9a is configured or programmed to control the squeegee unit 6 by the drive controller 9c. Specifically, the drive controller 9c controls driving of the squeegee Y-axis drive 52, the squeegee Z-axis drive 53, and the squeegee R-axis drive 54 to move the squeegee 51 in the Y and Z directions and rotate the squeegee 51 about the rotation axis that extends in the X direction.

The main controller 9a is configured or programmed to control the printing table unit 3 by the drive controller 9c. Specifically, the main controller 9a drives the X-axis drive 13, the Y-axis drive 14, the R-axis drive 15, and the Z-axis drive 16 by the drive controller 9c to move the board B in the X-direction, the Y-direction, and the Z-direction and rotate the board B about the rotation axis that extends in the Z direction. Furthermore, the main controller 9a drives the support plate drive 24 by the drive controller 9c to move the support plate 23 so as to move the backup pins 23a in the Z direction (upward-downward direction). The main controller 9a drives the board width axis drive 12a by the drive controller 9c to adjust the interval (width) between the pair of conveyors 12 in the Y direction. In addition, the main controller 9a drives a board conveyance axis drive 17 by the drive controller 9c to convey the board B in the X direction.

The main controller 9a is configured or programmed to control the camera unit 4 by the drive controller 9c. Specifically, the main controller 9a drives the camera X-axis movement mechanism 31 and the camera Y-axis movement mechanism 32 by the drive controller 9c to move the imager 33 (the board camera 33a and the mask camera 33b) in the X and Y directions.

The main controller 9a is configured or programmed to control the camera unit 4 by the camera controller 9e. Specifically, the main controller 9a controls the board B imaging operation of the board camera 33a by the camera controller 9e. The main controller 9a controls the mask M imaging operation of the mask camera 33b by the camera controller 9e.

The main controller 9a is configured or programmed to control the squeegee unit 6 by the IO controller 9d. Specifically, the main controller 9a controls the moving up and down operation of the slide portion 55a of the mask slider 55 by the JO controller 9d.

The main controller 9a is configured or programmed to control the mask replacement unit 7 by the IO controller 9d. Specifically, the main controller 9a controls the elevating operation of the elevating unit 63 to move the first storage 61 and the second storage 62 of the mask replacement unit 7 up and down by the IO controller 9d. Furthermore, the main controller 9a is configured or programmed to receive a detection signal of the detection sensor 8 via the IO controller 9d when the detection sensor 8 detects the mask M stopped in a state of straddling the mask clamp member 5 and the first storage 61. The main controller 9a is configured or programmed to receive a detection signal of the detection sensor 8 via the IO controller 9d when the detection sensor 8 detects the mask M stopped in a state of straddling the mask clamp member 5 and the second storage 62.

(Structure of Replacement of Mask M)

As shown in FIGS. 6A to 6G, the control device 9 is configured or programmed to control the mask slider 55 of the mask replacement unit 7 to perform replacement operation to replace the mask M when the mask M used in the current production of the board B is replaced with the mask M used in the next production of the board B. The control device 9 is configured or programmed to control the solder scooping unit 56 to scoop the solder S on a mask M to be replaced (the mask M used in the current production of the board B) before the mask M replacement operation by the mask slider 55 of the mask replacement unit 7, and unload the solder S onto a replacement mask M (the mask M used in the next production of the board B) after the mask M replacement operation by the mask slider 55 of the mask replacement unit 7.

Figure 6A:
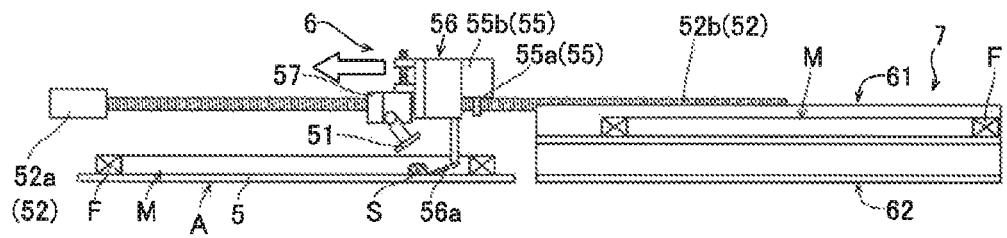
FIGS. 6A to 6G are schematic views showing mask replacement operation and solder transfer operation in the printing device according to the embodiment.
Figure 6B:
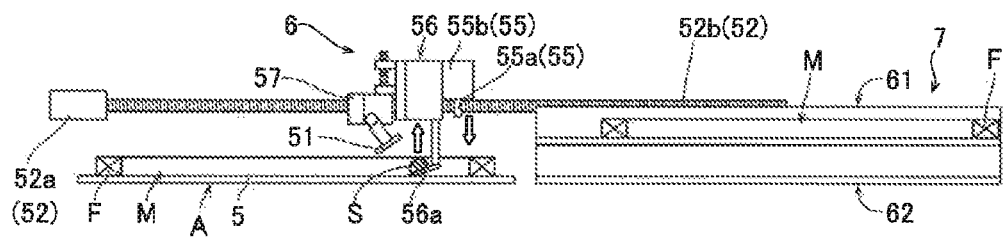
Figure 6C:
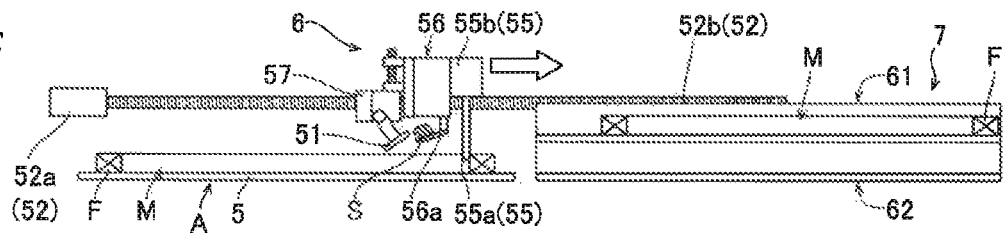

Specifically, first, as shown in FIG. 6A, the control device 9 controls the solder scooping unit 56 to lower the scoop 56a of the solder scooping unit 56 to the lowered position on the mask M used in the current production of the board B arranged in the operation position A. Then, as shown in FIG. 6B, the control device 9 controls the solder scooping unit 56 to move in the Y2 direction (a direction in which the solder S is scooped) in a state in which the scoop 56a is arranged in the lowered position. Thus, the solder S on the mask M used in the current production of the board B is moved and held on the scoop 56a of the solder scooping unit 56. Then, as shown in FIG. 6C, the control device 9 controls the solder scooping unit 56 to raise the scoop 56a of the solder scooping unit 56 that holds the solder S to the raised position. Then, the solder scooping unit 56 scoops the solder S on the mask M used in the current production of the board B.

Figure 6D:
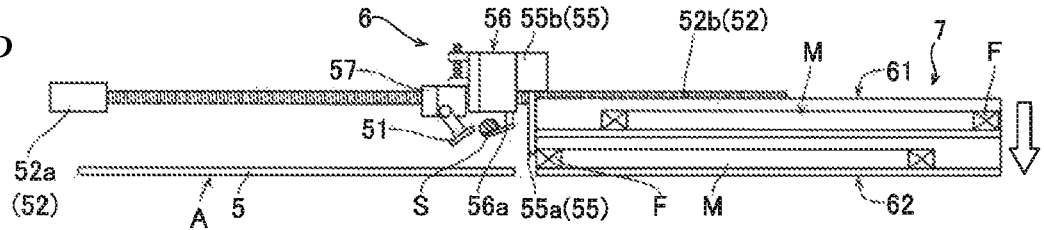
Figure 6E:
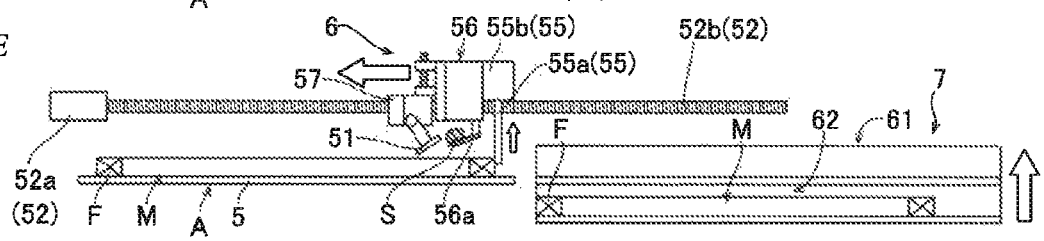

Then, as shown in FIGS. 6C and 6D, the control device 9 controls the mask slider 55 of the mask replacement unit 7 to move the mask M used in the current production of the board B from the operation position A (mask clamp member 5) to the second storage 62 of the mask replacement unit 7. Then, when the mask M used in the current production of the board B is stored in the second storage 62, the control device 9 controls the mask replacement unit 7 to lower the first storage 61 and the second storage 62 of the mask replacement unit 7 to the lowered position. Then, as shown in FIG. 6E, the control device 9 controls the mask slider 55 of the mask replacement unit 7 to move the mask M used in the next production of the board B from the first storage 61 of the mask replacement unit 7 to the operation position A (mask clamp member 5). Thus, the mask M used in the current production of the board B is replaced with the mask M used in the next production of the board B.

Figure 6F:
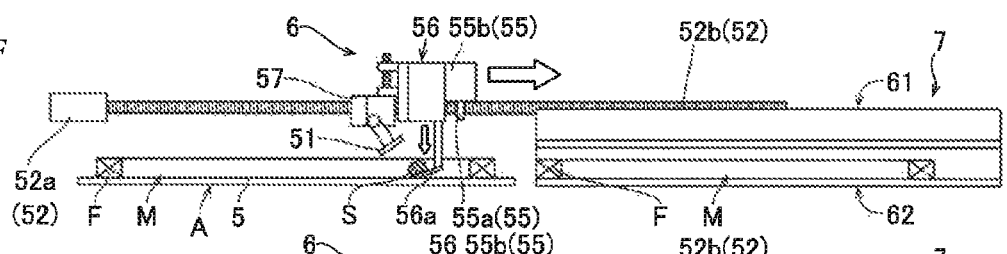
Figure 6G:
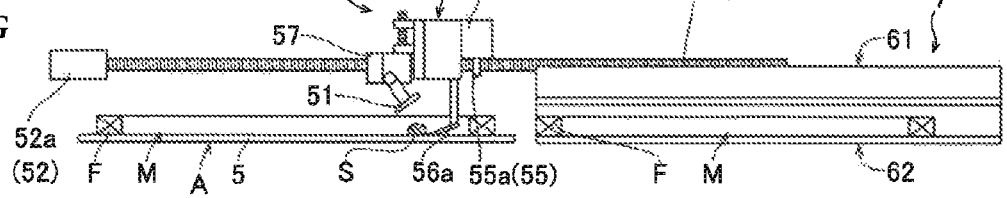

Then, when the mask M used in the next production of the board B is arranged in the operation position A (mask clamp member 5), the control device 9 controls the mask replacement unit 7 to raise the first storage 61 and the second storage 62 of the mask replacement unit 7 to the raised position. Then, as shown in FIG. 6F, the control device 9 controls the solder scooping unit 56 to lower the scoop 56a of the solder scooping unit 56 to the lowered position on the mask M used in the next production of the board B arranged in the operation position A. Then, as shown in FIG. 6G, the control device 9 controls the solder scooping unit 56 to move in the Y1 direction (a direction in which the solder S is unloaded) in a state in which the scoop 56a is arranged in the lowered position. Thus, the solder S on the scoop 56a of the solder scooping unit 56 is unloaded onto the mask M used in the next production of the board B.

(Structure Related to Solder Scooping Position)

In this embodiment, the control device 9 is configured or programmed to acquire, based on the measured width W of the solder S, the start position of movement of the solder scooping unit 56 in the Y2 direction (the direction in which the solder S is scooped) in solder S scooping operation, the end position of the movement of the solder scooping unit 56 in the Y2 direction in the solder S scooping operation, and the amount of movement of the solder scooping unit 56 in the Y2 direction in the solder S scooping operation.

Figure 8:
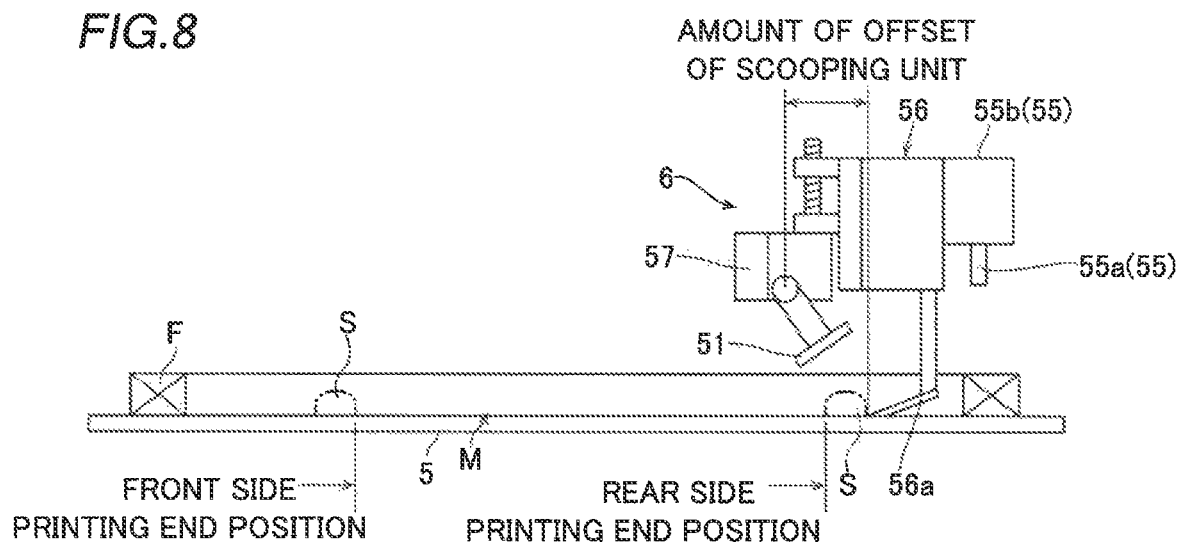
FIG. 8 is a schematic view for illustrating the amount of offset of a scooping unit, a front-side printing end position, and a rear side printing end position in the printing device according to the embodiment.
Figure 8:
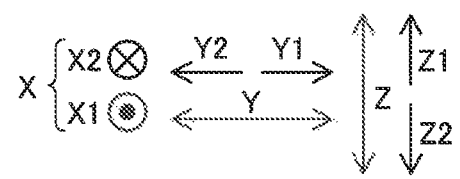
Figure 9A:
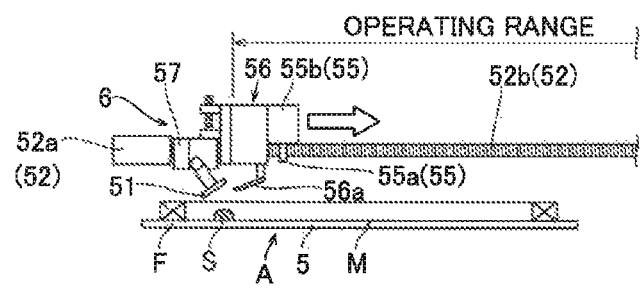
FIGS. 9A to 9D are schematic views showing operation in a case in which a coating material is located outside the operating range of the scooping unit in the printing device according to the embodiment.
Figure 9B:
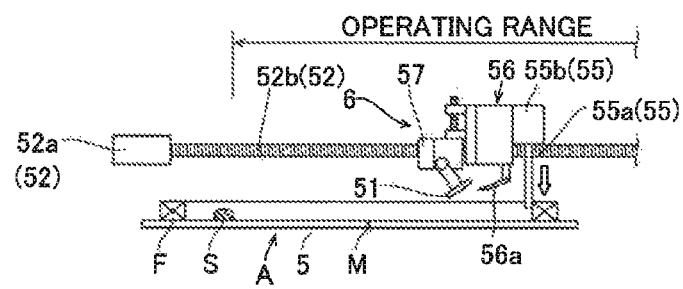
Figure 9C:
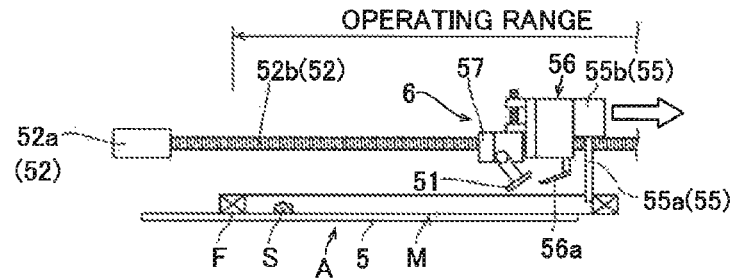
Figure 9D:
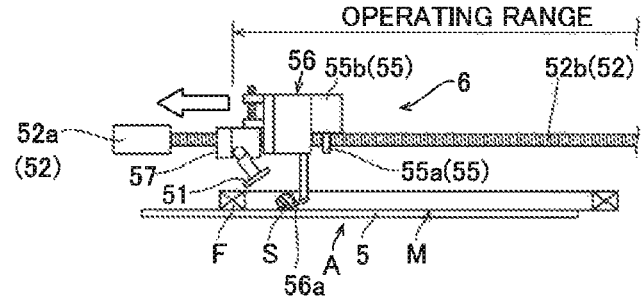

As shown in FIG. 8, the control device 9 is configured or programmed to acquire the start position of movement of the solder scooping unit 56 in the Y2 direction in the solder S scooping operation and the amount of movement of the solder scooping unit 56 in the Y2 direction in the solder S scooping operation based on the measured width W of the solder S when the solder S is located on the rear side (Y1 direction side) of the mask M (when the solder scooping unit 56 scoops the solder S on the mask M from the side (Y1 direction side) opposite to the side (Y2 direction side) in contact with the squeegee 51), for example.

Specifically, the control device 9 acquires the start position of the movement of the solder scooping unit 56 in the Y2 direction in the solder S scooping operation by the following formula (1). Furthermore, the control device 9 acquires the end position of the movement of the solder scooping unit 56 in the Y2 direction in the solder S scooping operation by the following formula (2). In addition, the control device 9 acquires the amount of movement of the solder scooping unit 56 in the Y2 direction in the solder S scooping operation by the following formula (3).

Start Position=Rear Side Printing End Position+ Amount of Offset of Scooping Unit+Measured Solder Width+Margin   (1)

End Position=Rear Side Printing End Position+ Amount of Offset of Scooping Unit−Margin   (2)

Amount of Movement=Start Position−End Position   (3)

The rear side printing end position is represented by the following formula (4). An end distance is a distance that the squeegee 51 moves beyond the size of the board B when the solder S is printed on the board B. The mask center coordinates, the board size, and the end distance can be acquired based on design information.

Rear Side Printing End Position=Mask Center Coordinates+Board Size/2+End Distance (4)

The amount of offset of the scooping unit is a separation distance between the squeegee 51 and the scooping unit 56 in the scooping unit 56 in the Y direction. The amount of offset of the scooping unit is a distance in the Y direction from the center of rotation of the squeegee 51 to the tip of the scoop 56a of the scooping unit 56, for example. The amount of offset of the scooping unit can be acquired based on the design information. Furthermore, the margin at the start position and the margin at the end position are values indicating a margin. The margin at the start position and the margin at the end position may be fixed values or may be values acquired according to the measured width W of the solder S. The margin at the start position and the margin at the end position may have different values.

The control device 9 is configured or programmed to acquire the end position of the movement of the solder scooping unit 56 in the Y2 direction in the solder S scooping operation and the amount of movement of the solder scooping unit 56 in the Y2 direction in the solder S scooping operation based on the measured width W of the solder S when the solder S is located on the front side (Y2 direction side) of the mask M (when the solder scooping unit 56 scoops the solder S on the mask M from the side (Y1 direction side) in contact with the squeegee 51), for example.

Specifically, the control device 9 acquires the start position of the movement of the solder scooping unit 56 in the Y2 direction in the solder S scooping operation by the following formula (5). Furthermore, the control device 9 acquires the end position of the movement of the solder scooping unit 56 in the Y2 direction in the solder S scooping operation by the following formula (6). In addition, the control device 9 acquires the amount of movement of the solder scooping unit 56 in the Y2 direction in the solder S scooping operation by the following formula (7).

Start Position=Front Side Printing End Position+
Amount of Offset of Scooping Unit+Margin (5)

End Position=Front Side Printing End Position+
Amount of Offset of Scooping Unit−Measured
Solder Width−Margin (6)

Amount of Movement=End Position−Start Position (7)

The front side printing end position is represented by the following formula (8).

Rear Side Printing End Position=Mask Center Coordinates−Board Size/2−End Distance (8)

The margin at the start position and the margin at the end position are values indicating a margin. The margin at the start position and the margin at the end position may be fixed values or may be values acquired according to the measured width W of the solder S. The margin at the start position and the margin at the end position may have different values.

The control device 9 is configured or programmed to control the solder width measuring unit 57 to measure the width W of the solder S during production of the board B before the solder S is scooped by the solder scooping unit 56. Specifically, the control device 9 is configured or programmed to control the solder width measuring unit 57 to measure the width W of the solder S after the board B on which printing has been performed is carried out and the next board B is carried in and before the solder S is printed on the carried-in, next board B during production of the board P. The control device 9 controls the solder width measuring unit 57 to measure the width W of the solder S during the replacement of the board B immediately before the solder S is scooped by the solder scooping unit 56, for example. Thus, the width W of the solder S can be measured in parallel with the replacement of the board B. Consequently, it is possible to prevent a time loss from occurring in order to measure the width W of the solder S.

(Structure of Movement of Mask at Time of Scooping Solder)

In this embodiment, as shown in FIGS. 9A to 9D, in the control device 9 is configured or programmed to control the mask slider 55 of the mask replacement unit 7 to move the mask M such that the solder S to be scooped is located within the operating range of the solder scooping unit 56 when the solder S to be scooped is located outside the operating range of the solder scooping unit 56 (outside a movement limit position). The control device 9 is configured or programmed to acquire the amount of movement of the mask M by the mask slider 55 of the mask replacement unit 7 based on the start position of the movement of the solder scooping unit 56 or the end position of the movement of the solder scooping unit 56 and the movement limit position of the solder scooping unit 56 when the solder S to be scooped is located outside the operating range of the solder scooping unit 56. The control device 9 is also configured or programmed to control the mask slider 55 of the mask replacement unit 7 to move the mask M by the acquired amount of movement.

For example, the control device 9 acquires the amount of movement of the mask M by the mask slider 55 of the mask replacement unit 7 by the following formula (9) when the start position of the movement of the solder scooping unit 56 on the front side (Y2 direction side) of the mask M or the end position of the movement of the solder scooping unit 56 on the front side of the mask M is outside the movement limit position of the solder scooping unit 56 on the front side of the mask M. Then, the control device 9 controls the mask slider 55 of the mask replacement unit 7 to move the mask M by the acquired amount of movement such that the solder S to be scooped is located within the operating range of the solder scooping unit 56.

Amount of Movement=|Movement Limit Position of
Solder Scooping Unit on Front Side−End Position of Movement of Solder Scooping Unit on
Front Side of Mask|+Margin (9)

(Structure of Detection of Solder Scooping State)

In this embodiment, the solder width measuring unit 57 functions as a scooping state detector configured to detect a state of solder S scooping by the solder scooping unit 56 after the solder S scooping operation. After the solder S scooping operation, the control device 9 controls the solder width measuring unit 57 to detect whether or not the solder S is present in a position on the mask M in which the solder S was arranged. Specifically, the control device 9 controls the solder width measuring unit 57 to irradiate the position on the mask M in which the solder S was arranged with a laser beam after the solder S scooping operation. The control device 9 determines whether or not the solder S is present in the position on the mask M in which the solder S was arranged based on the measurement result of the position in which the solder S was arranged acquired by the solder width measuring unit 57.

When determining that the solder S is not present in the position on the mask M in which the solder S was arranged, the control device 9 determines that the state of solder S scooping by the solder scooping unit 56 is normal. When determining that the solder S is present in the position on the mask M in which the solder S was arranged, the control device 9 determines that the state of solder S scooping by the solder scooping unit 56 is abnormal. The control device 9 is configured or programmed to perform a control to notify a user to check the state of the solder S when the state of solder S scooping by the solder scooping unit 56 is abnormal. At this time, the control device 9 is configured or programmed to perform a control to stop the printing device 1 by causing an error. Furthermore, the control device 9 is configured or programmed to control the solder scooping unit 56 to unload the solder S when the state of solder S scooping by the solder scooping unit 56 is abnormal.

The solder width measuring unit 57 also functions as an unloading state detector configured to detect a state of solder S unloading by the solder scooping unit 56 after solder S unloading operation. After the solder S unloading operation, the control device 9 controls the solder width measuring unit 57 to detect whether or not the solder S is present in a position on the mask M in which the solder S should be arranged (a position in which the solder S was unloaded). Specifically, the control device 9 controls the solder width measuring unit 57 to irradiate the position on the mask M in which the solder S should be arranged with a laser beam after the solder S scooping operation. The control device 9 determines whether or not the solder S is present in the position on the mask M in which the solder S should be arranged based on the measurement result of the position in which the solder S should be arranged acquired by the solder width measuring unit 57.

When determining that the solder S is present in the position on the mask M in which the solder S should be arranged, the control device 9 determines that the state of solder S unloading by the solder scooping unit 56 is normal. When determining that the solder S is not present in the position on the mask M in which the solder S should be arranged, the control device 9 determines that the state of solder S unloading by the solder scooping unit 56 is abnormal. The control device 9 is configured or programmed to perform a control to notify the user to check the state of the solder S when the state of solder S unloading by the solder scooping unit 56 is abnormal. At this time, the control device 9 is configured or programmed to perform a control to stop the printing device 1 by causing an error. Furthermore, the control device 9 is configured or programmed to control the solder scooping unit 56 to unload the solder S when the state of solder S unloading by the solder scooping unit 56 is abnormal.

(Solder Loading and Unloading Detection Process)

Figure 10:
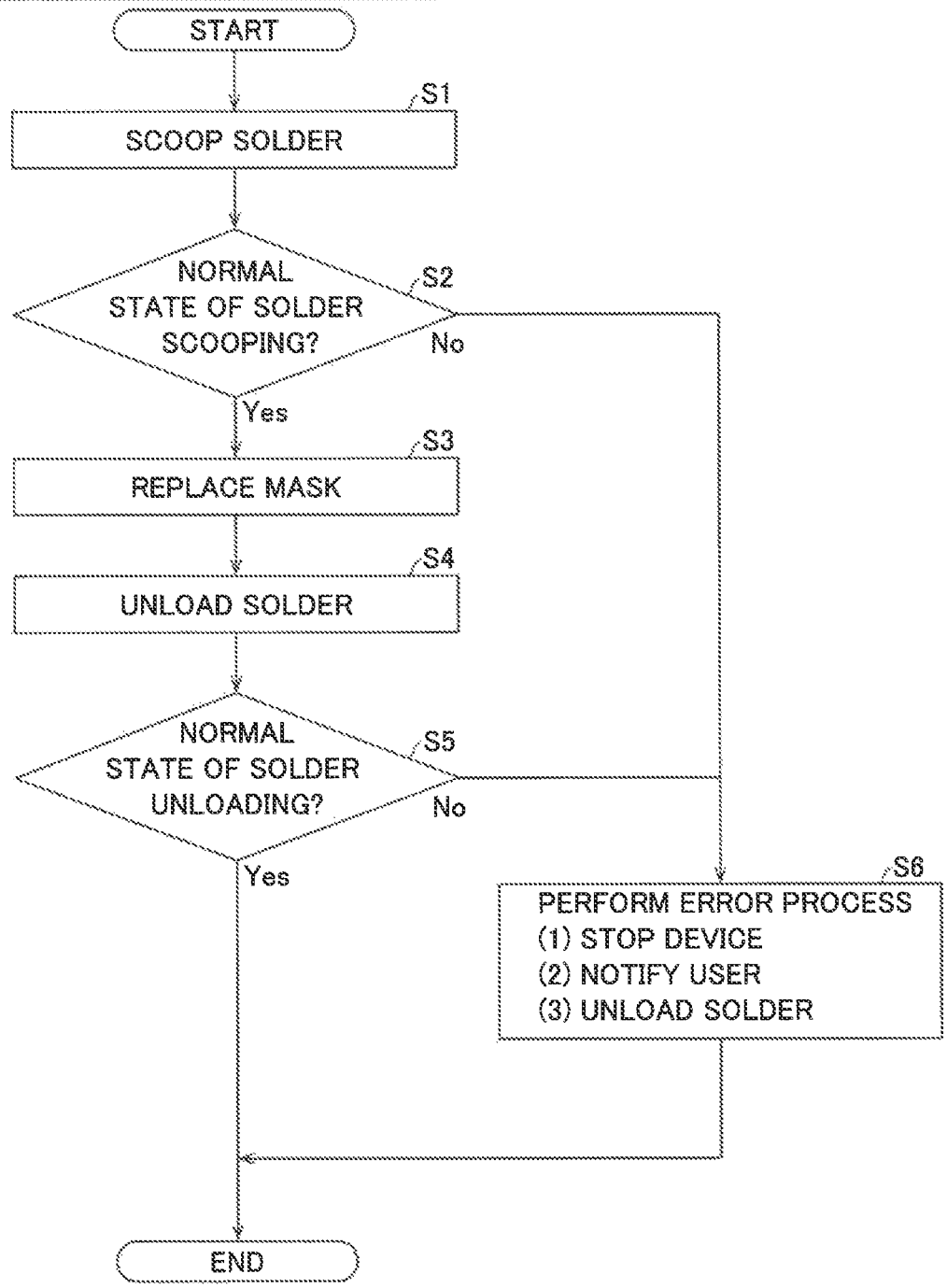
FIG. 10 is a flowchart for illustrating a solder loading and unloading detection process performed by the printing device according to the embodiment.

A solder loading and unloading detection process performed by the printing device 1 according to this embodiment is now described based on a flowchart with reference to FIG. 10. Each process operation of the flowchart is performed by the control device 9.

As shown in FIG. 10, first, in step S1, the solder scooping unit 56 scoops the solder S on the mask M.

Then, in step S2, it is determined whether or not a state of solder S scooping is normal based on the detection result of the state of solder S scooping by the solder width measuring unit 57 as a scooping state detector. When it is determined that the state of solder S scooping is normal, the process advances to step S3.

Then, in step S3, the mask slider 55 of the mask replacement unit 7 replaces the mask M.

Then, in step S4, the solder scooping unit 56 unloads the solder S onto the mask M.

Then, in step S5, it is determined whether or not a state of solder S unloading is normal based on the detection result of the state of solder S unloading by the solder width measuring unit 57 as an unloading state detector. When it is determined that the state of solder S unloading is normal, the solder loading and unloading detection process is terminated.

When it is determined in step S2 that the state of solder S scooping is abnormal or when it is determined in step S5 that the state of solder S unloading is normal, the process advances to step S6.

Then, in step S6, an error process is performed. In step S6, the printing device 1 is stopped, the user is notified to check the state of the solder S, and the solder scooping unit 56 unloads the solder S onto the mask M. After that, the solder loading and unloading detection process is terminated.

(Advantageous Effects of this Embodiment)

According to this embodiment, the following advantageous effects are achieved.

According to this embodiment, as described above, the control device 9 is configured or programmed to acquire, based on the measured width W of the solder S, the start position of the movement of the solder scooping unit 56 in the solder S scooping operation, the end position of the movement of the solder scooping unit 56 in the solder S scooping operation, and the amount of movement of the solder scooping unit 56 in the solder S scooping operation. Accordingly, the start position suitable for the actual width W of the solder S, the end position suitable for the actual width W of the solder S, or the amount of movement suitable for the actual width W of the solder S can be determined in consideration of the actual width W of the solder S. Consequently, it is possible to provide the printing device 1 capable of significantly reducing or preventing failure of the solder S scooping operation due to an insufficient amount of movement of the solder scooping unit 56 in the solder S scooping operation. Furthermore, when the amount of movement suitable for the actual width W of the solder S is acquired, an unnecessary increase in the amount of movement of the solder scooping unit 56 in the solder S scooping operation can be significantly reduced or prevented. Thus, the time required for the solder S scooping operation can be reduced to the minimum necessary.

According to this embodiment, as described above, the control device 9 is configured or programmed to control the mask slider 55 to move the mask M such that the solder S to be scooped is located within the operating range of the solder scooping unit 56 when the solder S to be scooped is located outside the operating range of the solder scooping unit 56. Accordingly, the operating range of the solder scooping unit 56 can be reduced by the amount of movement of the mask M that can be moved by the mask slider 55. Consequently, the device can be downsized by a reduction in the operating range of the solder scooping unit 56.

According to this embodiment, as described above, the printing device 1 includes the mask replacement unit 7 including the mask slider 55, the first storage 61, and the second storage 62. Accordingly, the mask slider 55 of the mask replacement unit 7 can be used as a mask mover that moves the mask M such that the solder S is located within the operating range of the solder scooping unit 56. Consequently, it is not necessary to provide a mask mover separately from the mask slider 55 of the mask replacement unit 7. Consequently, a mask mover is not provided separately from the mask slider 55 of the mask replacement unit 7, and thus the number of components can be reduced while the structure can be simplified. Furthermore, the mask M can be automatically replaced by the mask slider 55 as a mask replacer, and thus it is possible to save the user the trouble of replacing the mask M.

According to this embodiment, as described above, the control device 9 is configured or programmed to control the solder scooping unit 56 to scoop the solder S on the mask M to be replaced before the mask M replacement operation by the mask slider 55 and unload the solder S onto the replacement mask M after the mask M replacement operation by the mask slider 55. Accordingly, the solder scooping unit 56 can automatically transfer the solder S from the mask M to the mask M, and thus it is possible to save the user the trouble of transferring the solder S from the mask M to the mask M.

According to this embodiment, as described above, the printing device 1 includes the solder width measuring unit 57 as a scooping state detector configured to detect the state of solder S scooping by the solder scooping unit 56 after the solder S scooping operation. Accordingly, it can be checked whether or not the solder S has been correctly scooped by the solder scooping unit 56. Consequently, when the solder S has not been correctly scooped by the solder scooping unit 56, the device can be caused to appropriately operate such as stop, and it is possible to prevent printing defects from occurring.

According to this embodiment, as described above, the scooping state detector includes the solder width measuring unit 57. Accordingly, it is not necessary to provide the scooping state detector separately from the solder width measuring unit 57. Consequently, the scooping state detector is not provided separately from the solder width measuring unit 57, and thus the number of components can be reduced while the structure can be simplified.

According to this embodiment, as described above, the control device 9 is configured or programmed to perform a control to notify the user to check the state of the solder S when the state of solder S scooping by the solder scooping unit 56 is abnormal. Accordingly, based on the information of which the user is notified, the user can quickly perform an operation to resolve the abnormality Consequently, even when the device is stopped due to the abnormality, the abnormality can be quickly resolved, and the stop time of the device can be reduced.

According to this embodiment, as described above, the control device 9 is configured or programmed to control the solder scooping unit 56 to unload the solder S when the state of solder S scooping by the solder scooping unit 56 is abnormal. Accordingly, even when only a portion of the solder S is scooped by the solder scooping unit 56 at the time of abnormality, only the scooped portion of the solder S can be unloaded from the solder scooping unit 56. Consequently, it is possible to significantly reduce or prevent the next solder S scooping operation by the solder scooping unit 56 in a state in which only a portion of the solder S has been scooped by the solder scooping unit 56. Thus, it is possible to significantly reduce or prevent failure of the next solder S scooping operation by the solder scooping unit 56 due to only a portion of the solder S scooped by the solder scooping unit 56.

MODIFIED EXAMPLES

The embodiment disclosed this time must be considered as illustrative in all points and not restrictive. The scope of the present disclosure is not shown by the above description of the embodiment but by the scope of claims for patent, and all modifications (modified examples) within the meaning and scope equivalent to the scope of claims for patent are further included.

For example, while the example in which the present disclosure is applied to a printing device that automatically replaces a mask with a mask slider (mask replacer) has been shown in the aforementioned embodiment, the present disclosure is not restricted to this. The present disclosure may be applied to a printing device in which a user manually replaces a mask.

While the example in which the control device (controller) is configured to acquire the start position of the movement of the solder scooping unit (coating material scooping unit) in the solder scooping operation, the end position of the movement of the solder scooping unit in the solder scooping operation, and the amount of movement of the solder scooping unit in the solder scooping operation based on the measured width of the solder (coating material) has been shown in each of the aforementioned embodiment, the present disclosure is not restricted to this. In the present disclosure, the controller may be configured to acquire at least one of the start position of the movement of the coating material scooping unit in the coating material scooping operation, the end position of the movement of the coating material scooping unit in the coating material scooping operation, or the amount of movement of the coating material scooping unit in the coating material scooping operation based on the measured width of the coating material.

While the example in which the printing device is configured to move the mask such that the solder to be scooped is located within the operating range of the solder scooping unit when the solder (coating material) to be scooped is located outside the operating range of the solder scooping unit (coating material scooping unit) has been shown in the aforementioned embodiment, the present disclosure is not restricted to this. In the present disclosure, the printing device may not be configured to move the mask such that the coating material to be scooped is located within the operating range of the coating material scooping unit when the coating material to be scooped is located outside the operating range of the coating material scooping unit.

While the example in which the printing device includes the mask slider as a mask mover and a mask replacer has been shown in the aforementioned embodiment, the present disclosure is not restricted to this. In the present disclosure, a mask mover and a mask replacer may be provided independently of each other in the printing device.

Figure 11:
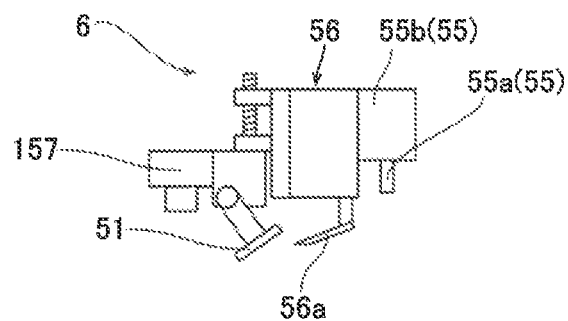
FIG. 11 is a schematic view showing a squeegee unit of a printing device according to a first modified example of the embodiment.

While the example in which the scooping state detector includes the solder width measuring unit (coating material width measuring unit) has been shown in the aforementioned embodiment, the present disclosure is not restricted to this. In the present disclosure, as in a first modified example shown in FIG. 11, the scooping state detector may include an imager 157. The imager 157 is provided on the squeegee unit 6 to image the mask M. In this case, the control device 9 controls the imager 157 to detect whether or not the solder S is present in the position on the mask M in which the solder S was arranged after the solder S scooping operation. Specifically, the control device 9 controls the imager 157 to image the position on the mask M in which the solder S was arranged after the solder S scooping operation. The control device 9 determines whether or not the solder S is present in the position on the mask M in which the solder S was arranged based on the imaging result of the position in which the solder S was arranged acquired by the imager 157. The control device 9 determines that the state of solder S scooping by the solder scooping unit 56 is normal when determining that the solder S is not present in the position on the mask M in which the solder S was arranged. Furthermore, the control device 9 determines that the state of solder S scooping by the solder scooping unit 56 is abnormal when determining that the solder S is present in the position on the mask M in which the solder S was arranged. The imager 157 may function as an unloading state detector.

Figure 12:
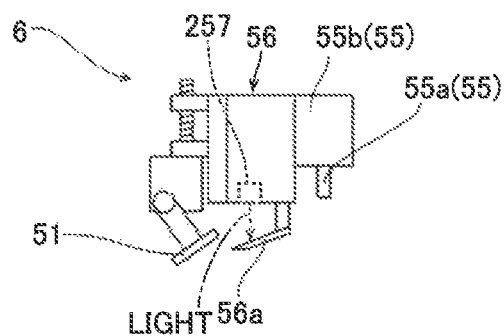
FIG. 12 is a schematic view showing a squeegee unit of a printing device according to a second modified example of the embodiment.

In the present disclosure, as in a second modified example shown in FIG. 12, the scooping state detector may include a light detector 257. The light detector 257 is provided in the scooping unit 56 to irradiate the scoop 56*a* of the scooping unit 56 with light and receive the reflected light. In this case, the control device 9 controls a photodetector 257 to detect whether or not the solder S is present on the scoop 56*a* of the scooping unit 56 after the solder S scooping operation. Specifically, after the solder S scooping operation, the control device 9 controls the photodetector 257 to irradiate a position on the scoop 56*a* of the scooping unit 56 in which the solder S should be arranged with light and receive the reflected light. The control device 9 determines whether or not the solder S is present in the position on the scoop 56*a* of the scooping unit 56 in which the solder S should be arranged based on the detection result of the position on the scoop 56*a* of the scooping unit 56 in which the solder S should be arranged, which is acquired by the photodetector 257. The control device 9 determines that the state of solder S scooping by the solder scooping unit 56 is normal when determining that the solder S is present in the position on the scoop 56*a* of the scooping unit 56 in which the solder S should be arranged. Furthermore, the control device 9 determines that the state of solder S scooping by the solder scooping unit 56 is abnormal when determining that the solder S is not present in the position on the scoop 56*a* of the scooping unit 56 in which the solder S should be arranged. The light detector 257 may function as an unloading state detector.

Figure 13:
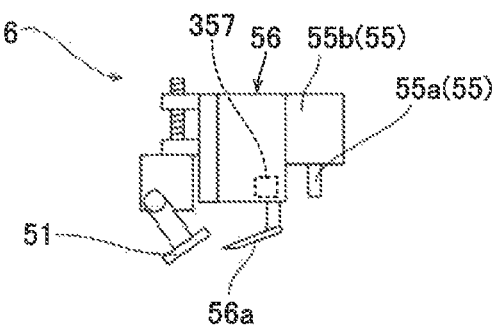
FIG. 13 is a schematic view showing a squeegee unit of a printing device according to a third modified example of the embodiment.

In the present disclosure, as in a third modified example shown in FIG. 13, the scooping state detector may include a weight detector 357. The weight detector 357 is provided in the scooping unit 56 to detect the weight of an object to be detected (solder S) arranged on the scoop 56*a* of the scooping unit 56. In this case, the control device 9 acquires the weight detection result by the weight detector 357 after the solder S scooping operation. The control device 9 determines whether or not the solder S is present on the scoop 56*a* of the scooping unit 56 based on the weight detection result by the weight detector 357. The control device 9 determines that the state of solder S scooping by the solder scooping unit 56 is normal when determining that the solder S is present on the scoop 56*a* of the scooping unit 56. The control device 9 determines that the state of solder S scooping by the solder scooping unit 56 is abnormal when determining that the solder S is not present on the scoop 56*a* of the scooping unit 56. The weight detector 357 may function as an unloading state detector. According to the structure as in each of the first to third modified examples, the state of solder S scooping by the solder scooping unit 56 can be easily detected by the imager 157, the light detector 257, or the weight detector 357 after the solder S scooping operation.

While the process operations performed by the control device are described, using the flowchart described in a manner driven by a flow in which processes are performed in order along a process flow for the convenience of illustration in the aforementioned embodiment, the present disclosure is not restricted to this. In the present disclosure, the process operations performed by the control device may be performed in an event-driven manner in which processes are performed on an event basis. In this case, the process operations may be performed in a complete event-driven manner or in a combination of an event-driven manner and a manner driven by a flow.

What is claimed is:

1. A printing device comprising:
   a squeegee configured to print, on a board, a coating material on a mask;
   a coating material scooping unit configured to scoop the coating material on the mask;
   a coating material width measuring unit configured to measure a width of the coating material on the mask; and
   a controller configured or programmed to acquire, based on the width of the coating material that has been measured, at least one of a start position of movement of the coating material scooping unit in coating material scooping operation, an end position of the movement of the coating material scooping unit in the coating material scooping operation, or an amount of the movement of the coating material scooping unit in the coating material scooping operation.

2. The printing device according to claim 1, further comprising:
   a mask mover configured to move the mask; wherein
   the controller is configured or programmed to control the mask mover to move the mask such that the coating material to be scooped is located within an operating range of the coating material scooping unit when the coating material to be scooped is located outside the operating range of the coating material scooping unit.

3. The printing device according to claim 2, further comprising:
   a scooping state detector configured to detect a state of coating material scooping by the coating material scooping unit after the coating material scooping operation.

4. The printing device according to claim 3, wherein the scooping state detector includes the coating material width measuring unit.

5. The printing device according to claim 3, wherein the scooping state detector includes an imager, a light detector, or a weight detector.

6. The printing device according to claim 3, wherein the controller is configured or programmed to perform a control to notify a user to check a state of the coating material when the state of the coating material scooping by the coating material scooping unit is abnormal.

7. The printing device according to claim 2, further comprising:
   a mask replacer including the mask mover and a mask storage configured to store the mask.

8. The printing device according to claim 7, further comprising:
   a scooping state detector configured to detect a state of coating material scooping by the coating material scooping unit after the coating material scooping operation.

9. The printing device according to claim 7, wherein the controller is configured or programmed to control the coating material scooping unit to scoop the coating material on the mask to be replaced before mask replacement operation by the mask replacer and unload the coating material onto a replacement mask after the mask replacement operation by the mask replacer.

10. The printing device according to claim 9, further comprising:
a scooping state detector configured to detect a state of coating material scooping by the coating material scooping unit after the coating material scooping operation.

11. The printing device according to claim 1, further comprising:
a scooping state detector configured to detect a state of coating material scooping by the coating material scooping unit after the coating material scooping operation.

12. The printing device according to claim 11, wherein the scooping state detector includes the coating material width measuring unit.

13. The printing device according to claim 12, wherein the controller is configured or programmed to perform a control to notify a user to check a state of the coating material when the state of the coating material scooping by the coating material scooping unit is abnormal.

14. The printing device according to claim 12, wherein the controller is configured or programmed to control the coating material scooping unit to unload the coating material when the state of the coating material scooping by the coating material scooping unit is abnormal.

15. The printing device according to claim 11, wherein the scooping state detector includes an imager, a light detector, or a weight detector.

16. The printing device according to claim 15, wherein the controller is configured or programmed to perform a control to notify a user to check a state of the coating material when the state of the coating material scooping by the coating material scooping unit is abnormal.

17. The printing device according to claim 15, wherein the controller is configured or programmed to control the coating material scooping unit to unload the coating material when the state of the coating material scooping by the coating material scooping unit is abnormal.

18. The printing device according to claim 11, wherein the controller is configured or programmed to perform a control to notify a user to check a state of the coating material when the state of the coating material scooping by the coating material scooping unit is abnormal.

19. The printing device according to claim 18, wherein the controller is configured or programmed to control the coating material scooping unit to unload the coating material when the state of the coating material scooping by the coating material scooping unit is abnormal.

20. The printing device according to claim 11, wherein the controller is configured or programmed to control the coating material scooping unit to unload the coating material when the state of the coating material scooping by the coating material scooping unit is abnormal.

* * * * *